United States Patent [19]

Ballato

[11] 4,158,805
[45] Jun. 19, 1979

[54] METHOD AND APPARATUS FOR TESTING CRYSTAL ELEMENTS

[75] Inventor: Arthur D. Ballato, Long Branch, N.J.

[73] Assignee: The United States of America as represented by the Secretary of the Army, Washington, D.C.

[21] Appl. No.: 870,694

[22] Filed: Jan. 19, 1978

[51] Int. Cl.² .......................................... G01R 29/22
[52] U.S. Cl. ................................................... 324/56
[58] Field of Search ............................. 324/56, 57 Q

[56] References Cited

U.S. PATENT DOCUMENTS

| | | | |
|---|---|---|---|
| 2,733,405 | 1/1956 | Gerber | 324/56 |
| 2,919,398 | 12/1959 | Guttwein et al. | 324/56 |
| 2,931,976 | 4/1960 | Gougoulis | 324/56 |
| 2,976,604 | 3/1961 | Kosowsky | 324/56 X |
| 3,593,125 | 7/1971 | Wilhelm | 324/56 |

FOREIGN PATENT DOCUMENTS 685811  5/1964  Canada ...................................... 324/56

OTHER PUBLICATIONS

Critchlow, G. F., *Measuring Crystal Inductance at High Frequencies*, Bell Laboratories Record, Apr. 1949, vol. XXVII, No. 4, pp. 138-140.

*Primary Examiner*—Gerard R. Strecker
*Attorney, Agent, or Firm*—Nathan Edelberg; Sheldon Kanars; Daniel Sharp

[57] ABSTRACT

A method and apparatus for determining anomalies in the frequency- or admittance-temperature characteristic of a piezoelectric crystal resonator by inserting a variable capacitance network in series with the crystal and electronically sweeping the value of the capacitance network by a control voltage applied thereto while the temperature remains constant and noting any abrupt change in the resonance frequency characteristic.

15 Claims, 15 Drawing Figures

TABLE I

| | | |
|---|---|---|
| $f_S = 1/2\pi\sqrt{L_1 C_1}$ | $f_L = f_S\sqrt{1+\alpha/r}$ | $C_{IL} = C_1(1-\alpha)^2/(1+\alpha/r)$ |
| $r = C_0/C_1$ | $r_L \approx r/(1-\alpha)$ | $R_{IL} = R_1/(1-\alpha)^2$ |
| $\alpha = C_0/(C_0+C_L)$ | $C_{OL} = C_0(1-\alpha)$ | $L_{IL} = L_1/(1-\alpha)^2$ |

ACTIVITY DIP SCANNER

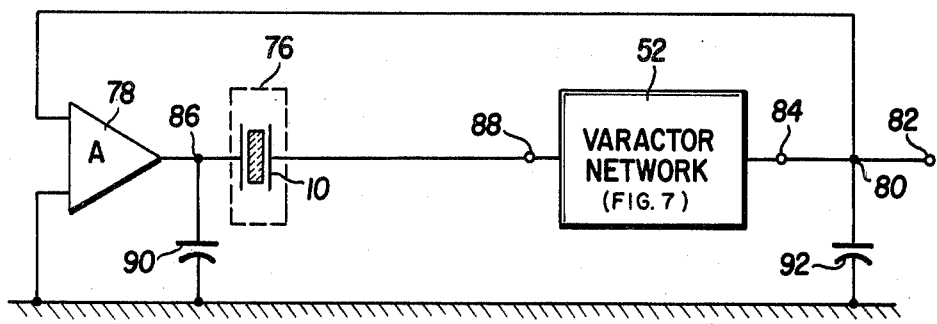
*FIG. 6A*
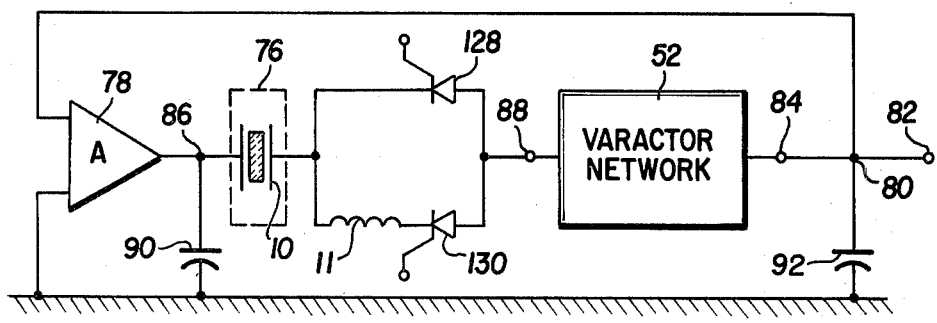
*FIG. 6B*
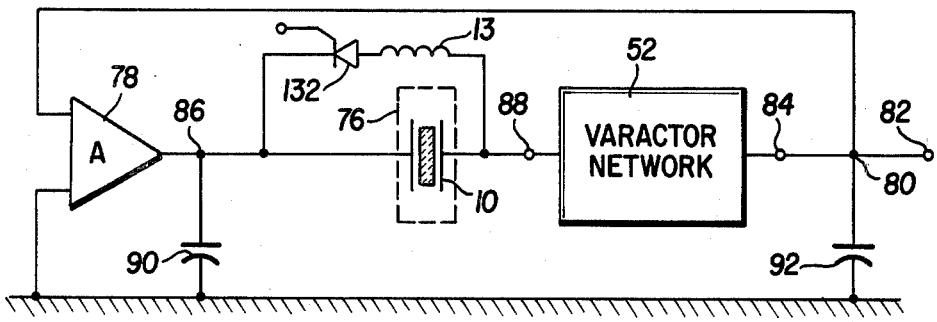
*FIG. 6C*
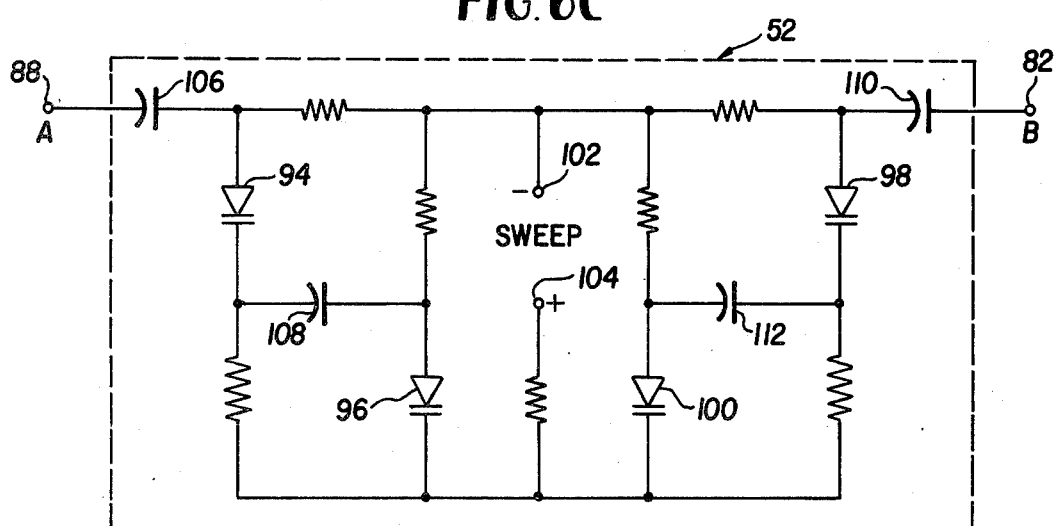
*FIG. 7* VARACTOR NETWORK

CIRCUIT     REACTANCE POLES AND ZEROS

METHOD AND APPARATUS FOR TESTING CRYSTAL ELEMENTS

The invention herein described may be manufactured and sold by or for the Government for governmental purposes without the payment of any royalties thereon or therefor.

BACKGROUND OF THE INVENTION

1. Field of the Invention

This invention relates generally to the electronic measurement of crystal resonator temperature anomalies and more particularly to the frequency or admittance-temperature anomalies occurring in quartz crystal resonators.

2. Description of the Prior Art

Because of precision frequency control requirements for digital communication and position location systems currently in use, it is imperative that the crystal resonators utilized have very smooth and reproducible frequency-temperature characteristics. One reason why the characteristic is required to be smooth is because the temperature compensating network used in temperature compensated crystal oscillators must be capable of compensating for the usual "S" shaped curve of an AT-cut crystal, for example. Consequently, it is the usual practice to individually test each crystal resonator in an oven over a selected temperature range and monitor the oscillator frequency on a continuous basis. Such temperature runs require expensive apparatus and take considerable time for a careful scan. If the crystal is acceptable, the frequency-temperature characteristic will exhibit a substantially smooth "S" curve. If on the other hand the crystal has an anomaly in its frequency-or admittance-temperature characteristic, referred to as an "activity dip" or "band break," the curve exhibits an abrupt change or discontinuity. Either the frequency or resistance curve can be used as an indication of the presence of such an anomaly depending upon where on the "S" curve the "activity dip" occurs.

These anomalies are generally considered to be caused by various combinations of different modal frequencies coming into coincidence at particular temperatures because of differing temperature coefficients. At least two distinct species of activity dips exist; one being "design-related" dips, while the other is termed "process-related" dips. The latter type arises from shortcomings in the processing phases, where for example, an improperly deposited electrode film peels or blisters in a reversible, temperature-dependent manner. Design-related activity dips are those for which structural configuration remains unaffected by temperature changes, but instead depends solely upon geometry and material constants. It is these latter type anomalies to which the present invention is directed. The presence of design-related activity dips is a persistent problem and as a consequence, necessitates a great deal of costly testing for medium and high precision resonator units in the manner mentioned above, i.e., temperature runs. Doubly rotated cuts generally could be expected to have even more problems in this regard than AT-cut crystals, since they exhibit less symmetry and have therefore a more complicated mode spectrum when lateral boundaries are taken into account. The exception appears to be the SC/TTC orientation for which activity dips have yet to be encountered.

The modal interference that takes place can be either linear or non-linear. If the impressed voltage is capable of driving the desired thickness mode and at the same time drive a harmonic effectual mode, for example, then the vibrator admittance will reflect this fact as the linear superposition of the separate modal admittances. With temperature changes, it is possible for the two resonance frequencies to cross and produce an anomaly. Such linear activity dips have been described by several investigators in the following publications: "Activity Dips in AT-Cut Crystals," A. Wood, et al., Proceedings 21st Annual Frequency Control Symposium (AFCS), Ft. Monmouth, N.J., April, 1967, pp. 420-435, and "The Unwanted Responses of Crystal Oscillator Controlled by AT-Cut Plate," H. Fukuyo, et al., Bulletin Tokyo Inst. Tech., No. 82, September, 1967, pp. 53-64; Proceedings 21st AFCS, April, 1967, pp. 402-419.

Non-linear activity dips are less well understood and perhaps more important. The Wood, et al. publication also found that the AT-Cut fundamental thickness shear frequency to be effected by interfering modes at twice its frequency. In a publication entitled "On Activity Dips of AT Crystals At High Levels of Drive," C. Franx, Proceedings 21st AFCS, April, 1967, pp. 436-454, the same type of coupling due to a mode at three times the fundamental frequency was reported. Similar results were obtained and reported by the aforementioned Fukuyo reference. In all cases, the sensitivity of mode coupling to power levels is a characteristic of non-linearity.

It is an object therefore of the present invention to provide a new and improved method and apparatus for testing for activity dips in piezoelectric (quartz) resonators which obviates the heretofore required temperature runs.

SUMMARY

It has been discovered that the effect of inserting a capacitor in series with a crystal results in a shift of all resonance frequencies upwards by amounts roughly inversely proportional to the capacitance ratios of the modes and with the temperature coefficients of the various modes being similarly altered. As a result of this fact and because the interfering modes have differing temperature coefficients, it is possible to alter the activity dip temperature by a series load capacitance.

Briefly then, the subject invention is directed to the method and apparatus for coupling a voltage variable capacitance network in series with a crystal resonator under test and applying a time varying control voltage to the capacitor network for sweeping the capacitance value while the temperature remains substantially constant and detecting the resonance frequency change as a function of the change in control voltage and thereafter observing whether or not an abrupt discontinuity or dip occurs in the frequency or resistance characteristic of the resonator.

The means employed comprises an RF oscillator circuit including an amplifier having the resonator under test and a series coupled varactor diode network coupled thereto. An electronic sweep voltage generator under the control of a circuit means which may be programmed, for example, varies the capacitance of the varactor network in a predetermined time-varying fashion such as a linear sweep. The RF signal output from the oscillator is coupled to a signal mixer which also has applied thereto a reference frequency from a fixed reference oscillator. The two RF signals are mixed, i.e., heterodyned and the difference output frequency is coupled to a frequency discriminator the output of which is fed to not only a visual display, but also the control means. The control circuit means also has a signal applied thereto corresponding to the actual RF frequency output from the oscillator, which is developed, for example, by an RF amplifier and a frequency counter coupled to the oscillator itself. Output means for providing a print out of the resonator's frequency characteristic is also coupled to the control signal means for providing a record of the frequency variation of the resonator as provided by the output of the frequency discriminator.

BRIEF DESCRIPTION OF THE DRAWINGS

FIGS. 6A, 6B and 6C are electrical block diagrams of three circuit configurations of oscillator circuits shown in FIG. 5 incorporating a piezoelectric crystal under test;

FIG. 7 is an electrical schematic diagram illustrative of the voltage variable capacitance network coupled in series to the crystal under test shown in the oscillator circuits shown in FIGS. 6A–6C;

DESCRIPTION OF THE PREFERRED EMBODIMENTS

Figure 1:
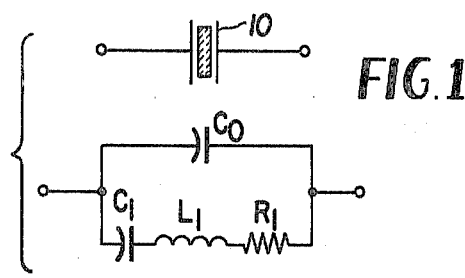
FIG. 1 is a diagram illustrative of a piezoelectric crystal resonator and its electrical equivalent circuit.
Figure 2:
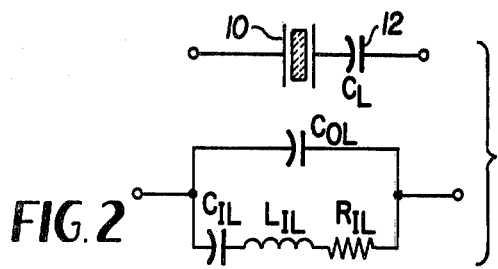
FIG. 2 is a diagram illustrative of the crystal resonator shown in FIG. 1 with a series load capacitor coupled thereto as well as its respective electrical equivalent circuit.

Referring now to the drawings, there is shown in FIG. 1 a crystal resonator 10 which is represented by a Butterworth-Van Dyke equivalent electrical circuit consisting of the capacitance $C_0$ shunted by a series combination of a resistance $R_1$ and inductance $L_1$ and a capacitance $C_1$. The effect of inserting a load capacitor 12 of the value $C_L$ in series with the crystal 10 as shown in FIG. 2 can also be represented by a circuit of the same form but with modified values of a capacitance $C_{0L}$ shunted by series combination of resistance $R_{1L}$, inductance $L_{1L}$ and capacitance $C_{1L}$ with modified values which are expressed by the appropriate formulas shown in Table I, which are given in terms of the crystal capacitance ratio r which is defined as:

$$r = C_0/C_1 \quad (1)$$

and the load capacitance ratio alpha, which is defined as:

$$\alpha = C_0/(C_0 + C_L). \quad (2)$$

Whereas $$f_R \approx f_s \quad (3)$$

the effect of the series load capacitor 12 is to shift the frequency $f_R$ to a higher frequency $f_L$ according to the expression:

$$f_L = f_s \sqrt{1 + \alpha/r}. \quad (4)$$

Where for example the resonator 10 comprises an AT cut quartz crystal operated at $f_s$, a typical value for r is in the order of 250. Accordingly, by inserting the series load capacitor 12 in series with the resonator 10, the frequency $f_L$ can be pulled by changes in the value of $C_L$. An interfering mode, on the other hand, is apt to have a very large capacitance ratio and so would be shifted very little by the presence of $C_L$. Because the effective capacitance of the thickness modes, such as the desired AT-cut shear mode, varies with the square of the harmonic, the overtones will shift correspondingly less than the fundamental. The same is also true of their non-linearly produced sub-harmonics. The series load capacitance 12 thus shifts upwardly, the different modes by different amounts. Accordingly, the points of intersection of the modes will also change, as will be shown particularly with reference to FIG. 4.

Figure 3:
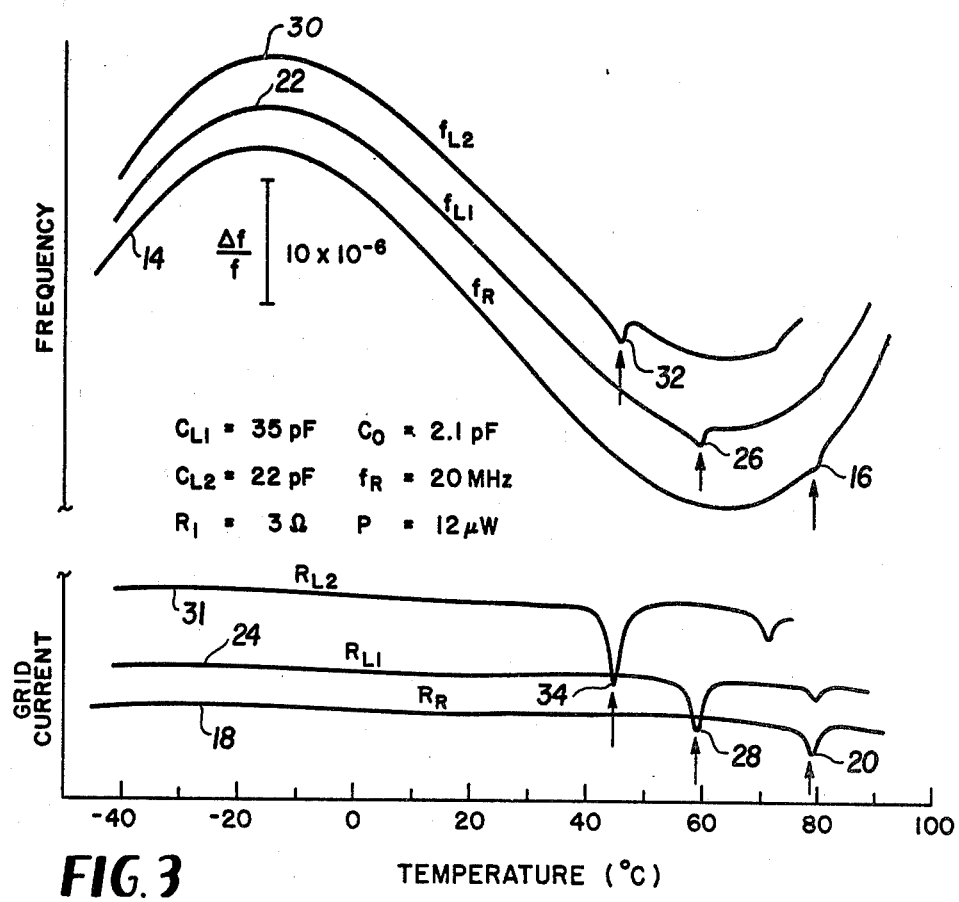
FIG. 3 is a graph illustrative of the shift in activity dips of a piezoelectric crystal such as shown in FIG. 1 in response to various values of load capacitance coupled in series thereto as shown in FIG. 2.

Referring now to FIG. 3, which is illustrative of prior art practice, there is demonstrated the effects of two different load capacitance values $C_{L1}$ and $C_{L2}$ in series with the crystal 10 having a resonance frequency of $f_R = 20$MHz. The S-shaped curves shown in the figure are illustrative of frequency vs. temperature characteristics typically of an AT-cut quartz crystal resonator. Curve 14, for example, is descriptive of the frequency vs. temperature characteristic of the crystal 10 without a load capacitor. The resonance frequency accordingly varies according to the curve 14 and exhibits an anomaly 16 at a temperature of approximately 78° C. as indicated by the arrow. A second type of curve 18 corresponding to grid current vs. temperature and which is also illustrative of crystal admittance exhibits an anomaly 20 at the same temperature. These curves were obtained by a typical heat run obtained in a manner well known to those skilled in the art. It was observed, however, that when the load capacitor 12 of a value $C_{L1}$ was placed in series with the crystal 10, curves 22 and 24 resulted exhibiting respective activity dips 26 and 28 which were displaced downward in temperature to approximately 58° C. Where, for example, the value of $C_{L1} = 35$pF, the substitution of a relatively smaller capacitor $C_{L2} = 22$pF produced curves 30 and 31 with a further downward shift of the activity dip to 44° C. as evidenced by the dips 32 and 34 respectively. The downward shift in temperature for the anomaly means that the temperature coefficient of the interfering mode is negative. The $\Delta f/f$ scale shown in FIG. 3 is meant to pertain to each of the three S-curves 14, 22 and 30 individually; the vertical separation between the S-curves is not to scale but has been greatly reduced so that they can be compared more easily. The resistance curves 18, 24 and 31 have been similarly displaced for clarity and accordingly the relative position is unimportant.

Figure 4:
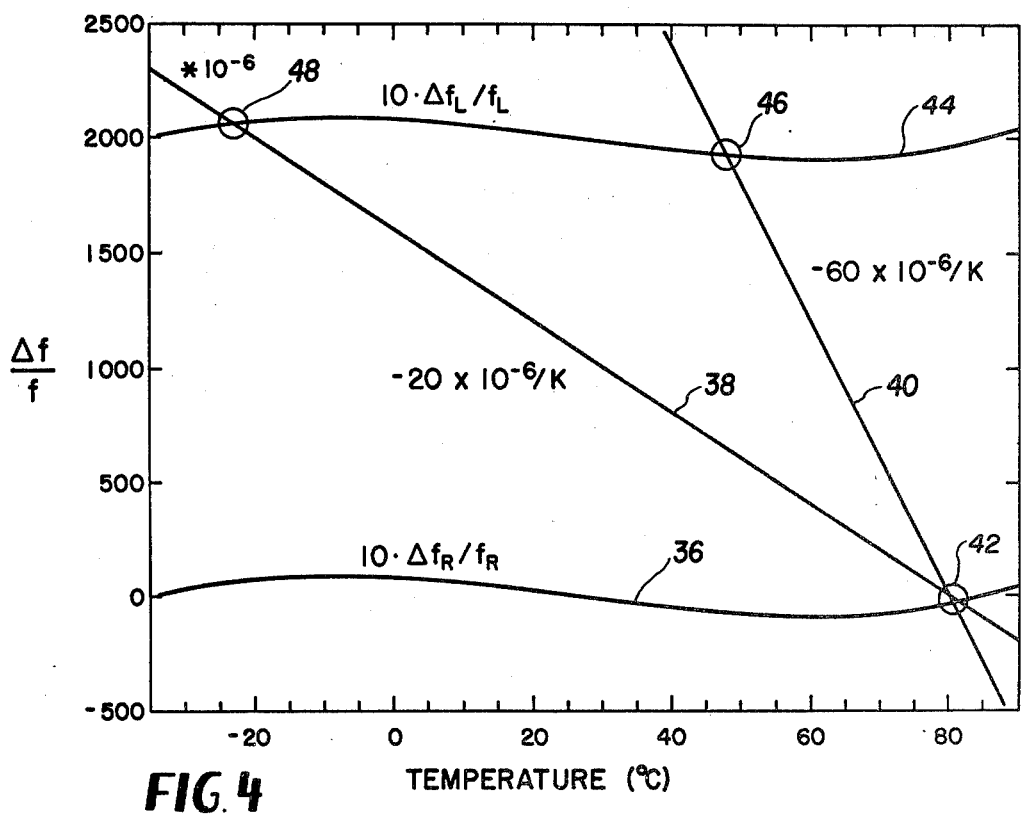
FIG. 4 is a graph being further illustrative of the shift of the resonance frequency of the crystal to a higher frequency in response to a series load capacitor as shown in FIG. 2.

Referring now to FIG. 4, the shift of the activity dip as a function of temperature is further clarified. The temperature-frequency curve 36 corresponds to curve 14 shown in FIG. 3. On the scale of the drawing, the curve is nearly horizontal; however, its vertical scale has been exaggerated by a factor of 10. Two curves 38 and 40 representing unwanted interfering modes have been drawn and intersect the curve 36 at a common point 42 located at approximately 80° C. As noted with respect to the curves shown in FIG. 3, the addition of the series load capacitor 12 shifts the resonant frequency upward. This is illustrated by curve 44. The points of intersection of curves 38 and 40 occur at points 46 and 48. Thus the mode associated with curve 40 produces a dip at 48°, while the mode evidenced by curve 38 produces a dip at −23° C.

While the fundamental interfering modes are meant to be represented by the curves shown in FIG. 4, it is only necessary that the harmonic or sub-harmonic producing the disturbance be represented as shown in FIG. 4, in which case the curve would be a virtual response of the figure. Thus, in the aforementioned case of Franx, if this interfering mode were to have its temperature behavior mapped and then to have its frequency divided by a factor of 3, it could be drawn as a virtual response on the figure along with the fundamental curve for the purpose of determining how the dip temperature changes with the value of $C_L$, i.e., the series load capacitance. The virtual curve would appear similar to the curves 38 or 40, while the actual interfering mode would appear at some harmonic frequency off the scale shown in FIG. 4.

Whereas the prior art method of testing for activity dips required temperature runs according to FIG. 3 to be made, the observance of the effect that the resonant frequency as well as the activity dips shift as a function of the load capacitor placed in series with the crystal resonator, provides a method of eliminating time consuming temperature scans for determining the existence of activity dips. In other words, the temperature scan heretofore required can be eliminated by sweeping or scanning the value of capacitance placed in series with the resonator and tracking its resonance frequency change. This is accomplished by utilizing a variable load capacitance in the form of a voltage variable (varactor) diode network whose capacitance varies as a function of the applied voltage.

Figure 5:
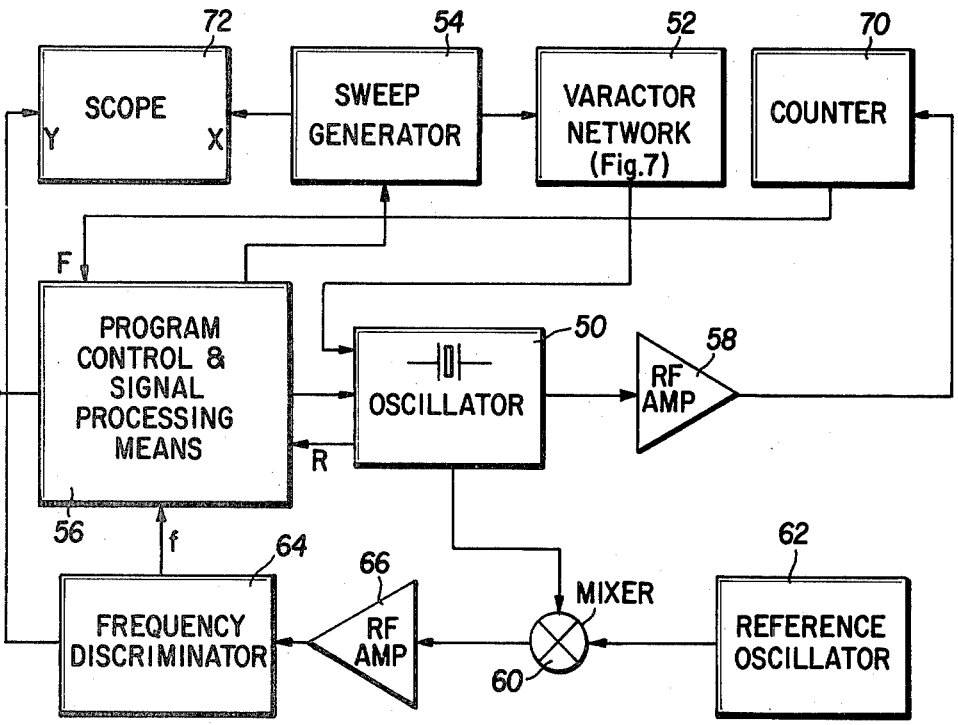
FIG. 5 is an electrical block diagram illustrative of the preferred embodiment of the subject invention for testing for activity dips of a piezoelectric crystal resonator.

The preferred embodiment of activity dip scanner apparatus utilized to practice the subject method is shown in block diagrammatic form in FIG. 5. There an RF oscillator circuit 50, configurations of which are shown in FIGS. 6A through 6C, is coupled to a varactor diode network 52 which has a periodic i.e., variable sweep voltage applied thereto from a sweep generator 54 which is adapted to apply a time varying voltage to the varactor network 52 for varying its capacitance characteristic in accordance with a predetermined scan procedure established by control circuit means 56 which may be a programmed control and signal processing unit implemented for example by a microprocessor or other type of programmable control apparatus, which is adapted to be responsive to resistance and frequency information for controlling system operation. The sweep generator 54 is adapted, for example, to supply a ramp voltage to the varactor network 52, which is operative to provide a variable $C_L$ in series with the crystal unit under test. In addition to being coupled to an RF amplifier 58, the output frequency from the oscillator 50 is fed to a mixer 60 which also receives a reference frequency from an oscillator 62 which is adapted to operate at the nominal frequency of the crystal. The difference frequency output from the mixer 60 is applied to a frequency discriminator circuit 64 by means of an RF amplifier 66. The output voltage of the discriminator 64 is fed back to the control means 56 which receives an additional input of the oscillator frequency from a counter circuit 70 coupled to the RF amplifier 58. Indicator means 72 which may be, for example, an oscilloscope for providing a visual indication of the change of the resonance frequency of the crystal under test in the oscillator circuit 50 as a function of the sweep voltage applied to the varactor network 52 is provided by means of having the Y axis input coupled to the output of the discriminator circuit 64 while the X axis input also is coupled to the sweep voltage from the generator 54. The control means 56 is also adapted to be coupled to an output device 74 which may be, for example, a printer or chart recorder for providing a permanent record of a capacitor scan. Additionally, the control means 56 is adapted to be operable to provide information for "go-no go" acceptance or rejection of the unit under test for activity dips as well as evaluation of crystal parameter's output of results as well as sequencing and control of input and output flow on an assembly line basis.

Figure 10:
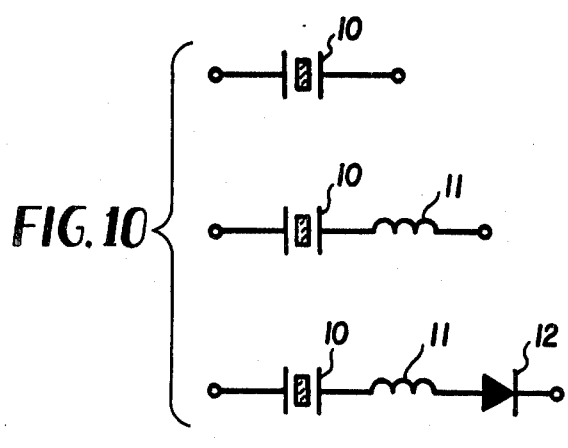
FIGS. 10–13 disclose the effects of including a series inductor and a parallel inductor to the crystal and series load capacitance for extending the frequency range within which activity dips can be detected.
Figure 11:
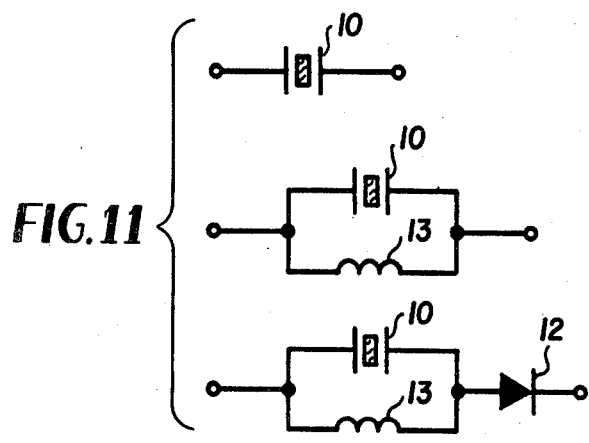

The oscillator circuit 50 requires care in its design, but its details are a matter of choice. However, one must be sure that the sought for anomalies originate in the crystal and not the oscillator so that unwanted frequency components must be strongly discriminated against. What is required is that the oscillator be such that it adjusts its frequency such that the crystal-load capacitor combination operates near or at its zero reactance point, i.e., resonance of $f_L$. Schematically, the oscillator in its simplest form is shown in FIG. 6A and consists of a crystal unit 76 under test, coupled to a feedback amplifier 78. One input to the amplifier is coupled to a reference potential shown as ground, while the other input is connected to a circuit junction 80 which is common to an output terminal 82 and a terminal 84 which connects to the varactor network 52. The output of the amplifier 78 couples to circuit junction 86, which is adapted to couple to one side of the crystal unit under test 76, while the other side of the crystal unit under test is connected to terminal 88, which is adapted to be connected to the other side of the varactor network 52. A first fixed capacitor 90 is coupled to ground from circuit junction 86, while a second fixed capacitor 92 is coupled to ground from circuit junction 80. Consideration of FIGS. 6B and 6C will be deferred for reasons which will become obvious when FIGS. 10 and 11 are discussed.

Figure 8:
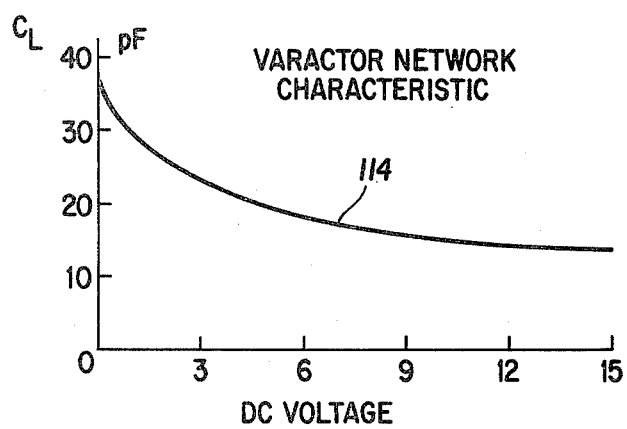
FIG. 8 is a graph illustrative of the capacitance vs. voltage characteristic of the network shown in FIG. 7.

The varactor network 52 is shown schematically in FIG. 7 and consists of a balanced network of four voltage variable or varactor diodes 94, 96, 98 and 100 coupled between the terminals 88 and 84, by means of a combination of fixed capacitors and resistors such that a sweep voltage applied across terminals 102 and 104 is applied across each of the varactor diodes. It can be seen that the fixed capacitors 106, 108, 110 and 112 are coupled between the varactor diodes 94, 96, 98 and 100 so as to form a string of series connected capacitances between the terminals 84 and 88. The capacitance vs. voltage characteristic for the varactor network shown in FIG. 7 is shown in FIG. 8. The curve 114 of FIG. 8 is non-linear and indicates that the value of capacitance $C_L$ is inversely proportional to the DC voltage applied across terminals 102 and 104.

Figure 9:
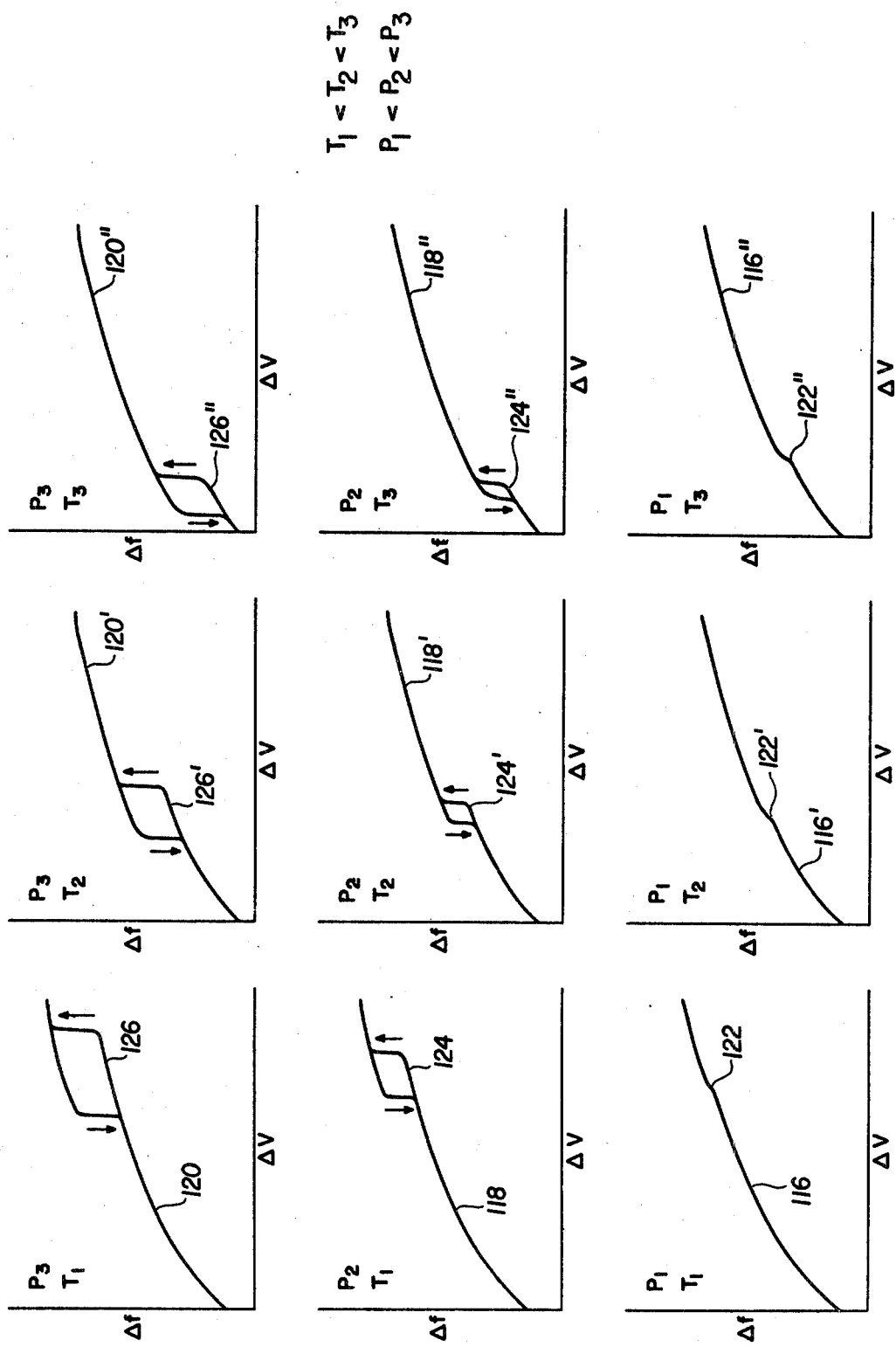
FIG. 9 is a set of graphs illustrative of the frequency change of the crystal in response to a change in the voltage applied to the varactor network shown in FIG. 7 at three discrete temperature and power levels.

Referring now to FIG. 9, there is disclosed a set of graphs illustrative of the subject method for determining activity dips in a crystal resonator by means of the apparatus shown in FIG. 5, wherein the sweep generator 54 shown in FIG. 5 comprises a ramp voltage up to a predetermined value and then ramps back to its starting point at the same rate. The set of graphs shown in FIG. 9 illustrate the operation of the subject method and comprises curves which would appear, for example, on the oscilloscope 72 or on the output means 74 for three fixed temperatures $T_1$, $T_2$ and $T_3$ wherein $T_1 < T_2 < T_3$ and for three separate power levels, $P_1$, $P_2$ and $P_3$ wherein $P_1 < P_2 < P_3$. It can be seen with reference to curves 116, 118 and 120 that for a first constant temperature $T_1$, that as the power level is varied, the activity dip shows up as an abrupt change in the slope of the curves. At the low power level $P_1$, the curve 116 exhibits a slight break 122 as the varactor voltage applied to the network as shown in FIG. 7 is varied. As the power level is increased to $P_2$ and $P_3$, the activity dip is manifested by the presence of respective hysteresis loops 124 and 126 in the curves 118 and 120 with the arrows indicating the direction of traverse of the frequency shift during the sweep of the capacitance value $C_L$ achieved by the varactor network 52 coupled in series with the crystal resonator unit under test 76.

Where, however, the power level is held constant, e.g. $P_2$ and the varactor network 52 is swept at different constant temperatures, $T_1$, $T_2$ and $T_3$, the hysteresis loop 124' and 124'' on the curves 118' and 118'' moves downward with increasing temperature. This indicates that the interfering mode has a negative temperature coefficient of frequency. This may readily be explained, since $C_L$ of the varactor network 52 decreases with increasing varactor voltage, as evidenced from FIG. 8 and since a decrease in $C_L$ increases the shift of $f_L$ from $f_R$ as shown in FIG. 3. Therefore, high varactor voltages mean large $f_L$ shifts. If the anomaly occurs at large varactor voltage at $T_1$ and again at a lower voltage at a higher temperature $T_3$, then the coefficient of the undesired interfering mode is negative.

It should be observed that the hysteresis loop characteristic depends upon the power level at which the system is operating and therefore depends upon operator choice. When no activity dip is present, the $\Delta f - \Delta v$ curve will be substantially smoothly monotonic, although not necessarily linear, as evidenced by the curves 116, 118 and 120. However, when an activity dip is present, the slope of the smooth curve experiences an abrupt change, indicating the existence of an anomaly. By the addition of a differentiating network, not shown, coupled to the output of the frequency discriminator 64, the dip can be detected more readily. Alternatively, the system shown in FIG. 5 can be arranged to use a voltage proportional to the crystal resistance (admittance) i.e., the grid current parameter shown in FIG. 3 as the input to the Y axis for the oscilloscope indicator 72 as shown in FIG. 5.

In different crystals, the anomaly may be more pronounced in either the frequency or the resistance shift mode of operation, and either may be used as a step in the detection of the anomaly as the value of the series load capacitance is swept in a manner previously described.

It should be pointed out that the series load capacitance 12 shown in FIG. 2 by itself can only shift the frequency $f_L$ of the crystal resonator 10 between the limits of $f_R < f_L < f_A$, that is between the resonance $f_R$ and anti-resonance $f_A$ of the crystal unit 76 (FIG. 6A). If at the temperature of the test the unwanted interfering mode causing the activity does not occur between these limits, then the anomaly will go undetected by the test and the curves 116, 120, etc., will not exhibit a break in the relatively smooth $\Delta f - \Delta v$ curve.

Figure 12:
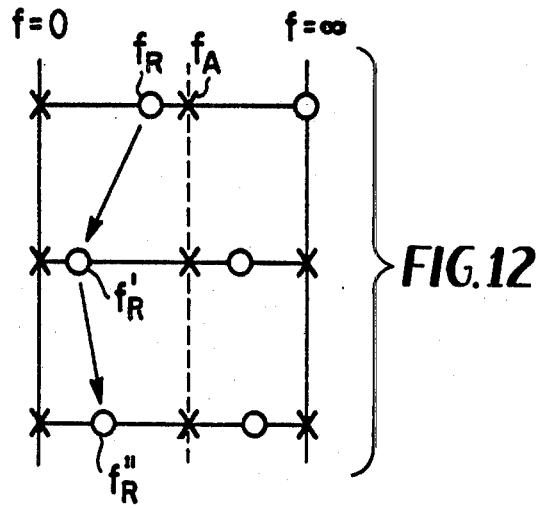
Figure 13:
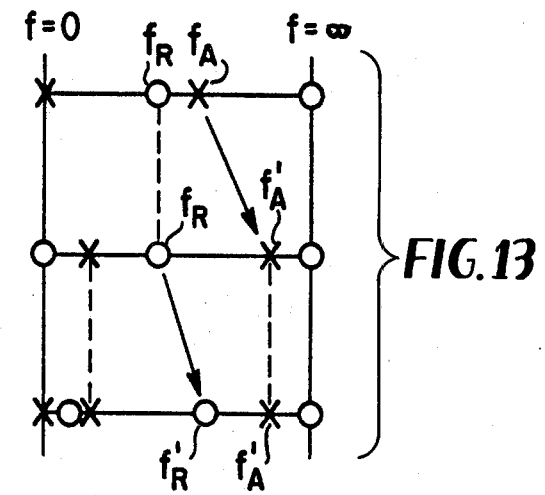

The present invention contemplates a means of extending the testing range of the method already described and consists in either adding an inductor 11 in series with the crystal 10 coupled to the series load capacitor 12 as shown in FIG. 10 or coupling an inductance 13 in parallel with the crystal 10 coupled to the series load capacitor 12 as shown in FIG. 11. The associated FIGS. 12 and 13 respectively disclose the effect of the series and parallel inductances 11 and 13 on the poles (x) where the reactance is infinite, i.e., where $f_A$ occurs and zeroes (o) where the reactance is zero, which occurs at the resonance frequency $f_R$. FIGS. 12 and 13 indicate the effect on the frequencies $f_R$ and $f_A$ between $f=0$ and $f=\infty$. The effect of the series inductance 11 which may be referred to as a "stretching coil" lowers the first reactance zero (0) the resonance frequency $f_R$ towards $f=0$, i.e., to the point $f'_R$. The inclusion of the series load capacitance 12, on the other hand, again moves the resonance frequency upward to the point $f''_R$ but which is less than the original resonance frequency $f_R$.

With respect to the addition of the parallel inductance 13 (FIG. 11), it has the effect of shifting the anti-resonance frequency $f_A$ upward to the frequency $f'_A$ while the resonance frequency remains the same at $f_R$. However, the addition of the load capacitance 12 causes a shift of the resonance frequency to $f'_R$ as shown in FIG. 13.

The implementation of either the inclusion of the series inductance 11 or the parallel inductance 13 is shown in FIGS. 6B and 6C respectively, it being understood, however, that both implementations can be combined into a single embodiment when desirable.

Referring first to FIG. 6B, the series inductor 11 can be electronically switched by means of a control signal (s) from the program control means 56 coupled to switch diodes, e.g., PIN diodes or SCR's 128 and 130 with one being adapted to be rendered conductive while the other is non-conductive. Thus, for example, when diode 128 is rendered conductive while diode 130 is non-conductive, the inductance is out of the circuit and a circuit configuration as shown in FIG. 6A is provided while on the other hand, by rendering diode 130 conductive with diode 128 being non-conductive, the inductor 11 is connected in series with the unit under test 76, including the resonator 10.

On the other hand, the parallel inductance 13 can be implemented as shown in FIG. 6C with a switch diode 132 coupled in series with the inductance 13 across the unit under test 76. Thus when diode 132 is rendered non-conductive, the inductance 13 is not in the circuit and a configuration as shown in FIG. 6A is provided, however, with diode 132 conductive, the inductance 13 is applied in parallel with the resonator 10 implementing the combination shown in FIG. 13.

Thus what has been shown and described is a simple, rapid and electronic means of detecting frequency or resistance (admittance) anomalies known as activity dips in piezoelectric crystals which is adapted to provide, for example, a rapid "go-no go" inspection method for eliminating resonator units having obvious and easily detected activity dips prior to making the costly temperature runs heretofore required. Also, when desirable, the apparatus described above provides instrumentation for readily determining other crystal parameters such as $C_0$, $C_1$, $R_1$ and $L_1$. Also, when desirable, a hybrid method may be utilized combined with the prior art temperature runs for interpolating between temperatures where, for example, the oven is programmed to dwell at each of a number of fixed temperatures, whereupon the varactor sweep method is used to search for dips between fixed temperatures.

Although the present invention is described with a certain degree of particularity, it should be understood that the present disclosure has been made by way of example only, and that various modifications and alterations may be resorted to and equivalents substituted without departing from the spirit and scope of the invention. Accordingly,

I claim as my invention:

1. The method of testing for the presence of anomalies in a crystal resonator comprising the steps of:
    operating said crystal resonator in an oscillator circuit which is controlled by said crystal resonator and a voltage-variable load capacitance in series therewith at a frequency in the vicinity of the nominal resonance frequency of said crystal resonator;
    applying a time-varying sweep control signal to said load capacitance to effect a continuous variation in an operating parameter of said oscillator circuit;
    continuously detecting during application of said sweep signal an output signal representative of said operating parameter;
    and applying continuously to a visual indicator said sweep control signal and said representative output signal to provide an abrupt change in indication of said indicator when said crystal resonator anomalies occur.

2. The method defined by claim 1 wherein said steps are carried out at a substantially constant temperature.

3. The method defined by claim 1 wherein said steps are carried out at a substantially constant power level.

4. The method defined by claim 1 further including the step of coupling an inductance in circuit with said crystal resonator for extending the range of indication of said anomalies.

5. The method defined by claim 4 wherein said inductance is connected in series with said crystal resonator.

6. The method defined by claim 4 wherein said inductance is connected in parallel with said crystal resonator.

7. In combination,
    an electrical oscillator circuit,
    a crystal resonator which is to be tested for the presence of anomalies,
    a voltage-variable load capacitance positioned in said oscillator circuit in series with said crystal resonator,
    said crystal resonator and load capacitance cooperating to determine the resonance frequency of said oscillator,
    sweep means for varying continuously a sweep voltage applied to said load capacitance to effect a continuous variation in an operating parameter of said oscillator circuit,
    means for detecting continuously an output signal representative of said operating parameter of said oscillator circuit, and
    visual indicating means responsive to said sweep voltage and to said output signal for providing an abrupt change in indication of said indicating means when anomalies occur in said crystal resonator.

8. The combination of claim 7 wherein said means for detecting comprises a frequency discriminator coupled to said oscillator and to a reference oscillator operating at the nominal resonant frequency of said crystal resonator.

9. The combination of claim 7 wherein said visual indicating means is an oscilloscope having quadrature input terminals and said sweep voltage and output signal are applied to different ones of said input terminals.

10. The combination of claim 8 wherein said visual indicating means is an oscilloscope having quadrature input terminals and said sweep voltage and output signal are applied to different ones of said input terminals.

11. The combination of claim 7 further including a microprocessor having a stored program therein and adapted to provide the signal processing of said sweep voltage and the output signal from said frequency discriminator.

12. The combination of claim 7 further including inductance means selectively coupled in circuit with the network consisting of said crystal resonator and said series connected capacitance for extending the displacement of the resonant and anti-resonant frequencies of said network.

13. The combination of claim 12 wherein said inductance means comprises an inductance connected in series with said network for lowering the resonant frequency of said network.

14. The combination of claim 12 wherein said inductance means comprises an inductance connected in parallel with said network for raising the anti-resonant frequency of said network.

15. The combination of claim 12 wherein said inductance means comprises a first inductance connected in series with said network and a second inductance connected in parallel with said network.

* * * * *